US006695912B2

(12) United States Patent
Pollak

(10) Patent No.: US 6,695,912 B2
(45) Date of Patent: Feb. 24, 2004

(54) METHOD FOR GROWING LASER CRYSTALS

(75) Inventor: Thomas M. Pollak, Amherst, NH (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 10/200,666

(22) Filed: Jul. 22, 2002

(65) Prior Publication Data

US 2003/0233974 A1 Dec. 25, 2003

Related U.S. Application Data

(63) Continuation-in-part of application No. 09/593,994, filed on Jun. 14, 2000, now abandoned.
(60) Provisional application No. 60/199,804, filed on Apr. 24, 2000.

(51) Int. Cl.[7] ............................................... C30B 15/04
(52) U.S. Cl. ........................... 117/13; 117/19; 117/30; 117/35; 117/36; 117/940
(58) Field of Search ............................. 117/13, 19, 30, 117/35, 36, 940

(56) References Cited

U.S. PATENT DOCUMENTS 5,394,420 A * 2/1995 Senn et al. .................... 372/39
5,441,803 A   8/1995 Meissner
6,014,393 A * 1/2000 Fulbert et al. ................. 372/41
6,269,108 B1 * 7/2001 Tabirian et al. ............... 372/39

* cited by examiner

Primary Examiner—Robert Kunemund
(74) Attorney, Agent, or Firm—Daniel J. Long

(57) ABSTRACT

A method for growing solid state laser crystal boules is disclosed that when made into laser rods do not need separate end caps attached to the laser rods. The crystal boule is grown as a single integral unit with three segments. Two segments, the end segments, are un-doped or non-laser active, and they flank a central segment of the boule that is doped with an active laser ion. A first end segment of the crystal boule is first grown from un-doped melt material in a first crucible by slowly withdrawing its growing end from the first melt. The boule is then transferred to a doped melt in a second crucible where its growing end is submersed therein to grow the doped, laser active central segment. The temperature of the melt in the second crucible is initially higher than the growing temperature of the first melt and causes the growing end of the boule to melt. The temperature of the second melt is then lowered and the central segment of the crystal boule is grown onto the first end segment in an integral manner by slowly withdrawing the crystal boule from the melt. After the central segment of the boule has been grown, the boule is removed from the second crucible and is transferred to the un-doped melt in the first crucible where its growing end is submersed therein to grow the doped second end segment. The temperature of the un-doped melt in the first crucible is initially higher than the growing temperature of the second melt and causes the growing end of the crystal boule to melt. The temperature of the un-doped first melt is then lowered and the second end segment of the crystal boule is grown in an integral manner by slowly withdrawing the crystal boule from the un-doped first melt.

17 Claims, 3 Drawing Sheets

CONVEX INTERFACE

PLANO INTERFACE

METHOD FOR GROWING LASER CRYSTALS

RELATED APPLICATION

This application claims priority under Provisional Application No. 60/199,804, filed on Apr. 24, 2000. This also is a Continuation-In-Part of U.S. application Ser. No. 09/593,994, filed on Jul. 14, 2000 abandoned.

FIELD OF THE INVENTION

This invention relates to lasers and more particularly to a method for growing solid state laser crystals boules that are comprised of distinctly different regions with respect to composition. This composition provides single crystal boules that simulate a "sandwich-line" composite that when made into laser rods do not need separate processing to form end caps onto the laser rods.

BACKGROUND OF THE INVENTION

There is a high interest in developing efficient lasers in the mid-infrared region for use in various applications including remote sensing, chemical detection and military laser countermeasure systems. In order to increase laser efficiency in this region, efforts have centered on pumping the laser crystals with high power diode lasers that have significantly higher efficiencies than other optical pumps. One approach to high power diode laser pumping is a configuration where the laser crystal is pumped from the ends rather than the sides, as has been common practice in the past. However, end pumping of lasers creates other problems that are discussed in the following paragraphs.

A temperature rise in lasers is a common problem, and particularly with solid state lasers. Such heating is the result of only a percentage of the applied pump energy being converted into useful laser radiation while at least a portion of the remaining energy is transferred into radiationless transitions and absorbed by the host lattice of the laser. To counteract the thermal effects generated by the pump radiation, the laser must be cooled. Typically, laser rods are cooled by direct contact to the outer surface of the rod barrel.

One of the problems encountered with end pumping of lasers is that at high power levels the central region of a laser rod heats to such a degree that thermal expansion causes a significant lens to form at the laser rod faces in response to the large temperature gradient between the hot core and cooled outer surface of the laser rod. This lensing can cause problems with the quality of the output laser beam. More importantly, if the input power is sufficiently high, the large temperature gradient can cause stresses to build up in the laser crystal to the point where fracture of the crystal occurs. This problem is exaggerated at the rod faces, the region where a large fraction of the energy is first absorbed in the laser crystal.

In the past, the problem of thermal lensing and thermal expansion induced stress causing crystal fracture has been solved by diffusion bonding end caps onto a laser crystal, such as taught in U.S. Pat. No. 5,936,984 issued Aug. 10, 1999 to Meissner et al. The end caps contain no dopant, so there is no absorption of diode radiation into the end caps, and there is no thermal lensing due to absorption in the end caps. The thermal lensing still occurs in the region of the doped laser crystal, but the end caps act to conduct the heat of the absorbed energy over a larger volume, thereby redistributing thermal induced stresses and eliminating the fracture problem. The laser rod end caps effectively reduce the thermal gradient and therefore the stress at the outer boundary of the laser rod section. The laser crystal can be operated at equivalent powers without the onset of thermal lensing, or can be operated at much higher average temperatures prior to the formation of significant thermal stresses that result in thermal lensing and/or fracture of the laser crystal.

As currently practiced, diffusion bonding of end caps onto a laser rod adds a significant number of steps to the process cycle. For example, the end caps and the laser rod must be optically ground and polished to a high degree of flatness for the bonding to be effective, making the process for bonding difficult, time consuming, and expensive. In order for a good bond to occur, the optical axes of the laser rod and the end caps must be precisely aligned. Misalignment of the crystal and the end caps can result in changing the polarization vector of the laser beam as it passes through the crystal, resulting in inefficiencies. The surfaces to be bonded must be cleaned to avoid any entrapment of particles. Sometimes, if the bonding is improperly done, the end caps begin to separate from the laser rod. This can result in stress induced fracture failures of the laser crystal.

One technique for bonding separately made end caps onto laser rods is taught in U.S. Pat. No. 5,441,803.

Thus, there is a need in the prior art for a way to eliminate end face fracture of laser rods under high power end pumping of the lasers when the pump energy is focused onto the ends of the laser rods. Although the prior art has demonstrated an approach to fabricate laser rods with end caps, it has been shown to be a very complicated process consisting of many individual steps. Additionally, there is a risk of misalignment of laser rod and end cap components that leads to failure of the laser rod. Accordingly, there is a need to provide composite laser rods using a less complex process.

SUMMARY OF THE INVENTION

The stated problems in the prior art are solved by the present invention. A method is disclosed for growing a high power solid state laser crystal that does not experience thermal expansion lensing that can cause crystal fracture under high power pumping on the end of the laser rod without the need for separate end caps as taught in the prior art. To accomplish this, the crystal is grown as a single integral unit with three segments. The crystal fabrication is done at the crystal boule level rather than at the individual laser-rod level. Two segments, the end segments, are un-doped, and they flank a central segment of the crystal that is doped with an active laser ion. The integral end segments replace the separate end caps. This results is significant cost savings because the complexity of preparing separate end caps is eliminated, and preparation and diffusion bonding of the separate end caps onto the laser rod is eliminated. In addition, there is never any misalignment of a crystal and its end caps with resultant potential separation of the end caps from the laser rod.

DESCRIPTION OF THE DRAWING

The invention will be better understood upon reading the following Detailed Description in conjunction with the drawing in which.

DETAILED DESCRIPTION

As briefly mentioned in the Summary of the Invention, the invention is a method for growing a high power, solid state laser crystal that does not experience thermal expansion lensing that can cause crystal fracture under high power pumping on the end(s) of the laser rod. This is achieved without the need for a process to attach separate end caps as taught in the prior art. To accomplish this goal, the crystal boule is grown as a single integral unit with three segments. Two segments, the end segments, are un-doped, and they flank a central segment of the crystal that is doped with an active laser ion. The crystal fabrication is done at the crystal boule level, rather than at the individual laser-rod level, using the well-known Czochralski Method of growing the crystal boule from a melt.

Figure 1:
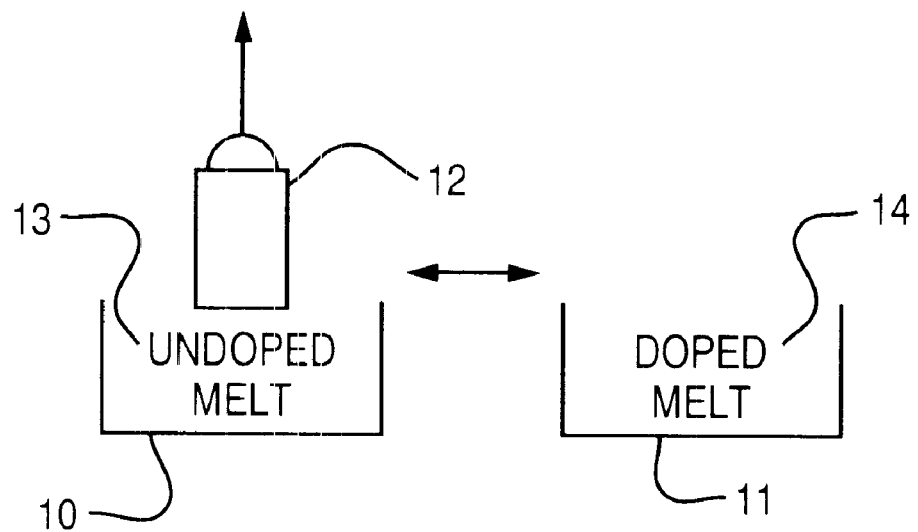
FIG. 1 shows two crucibles with doped and un-doped melt between which a crystal boule is moved to grow a three segment crystal boule in accordance with the teaching of the present invention.

In accordance with the teaching of the preferred embodiment of the invention, two melt crucibles 10 and 11 are utilized, as shown in FIG. 1, each with its own furnace (not shown). Each crucible 10 and 11 contains a melt, 13 and 14 respectively, of the same compound, but one melt 14 is doped with an active laser ion. Melt 13 is yttrium lithium fluoride and melt 14 is yttrium lithium fluoride doped with thulium and/or holmium in a manner and at levels well known in the laser art. Yttrium lithium fluoride infrared lasers doped with holmium or erbium are known in the art as may be seen in U.S. Pat. No. 5,843,073.

The un-doped base melt material 13 in crucible 10 is yttrium lithium fluoride, and the active laser ions added to dope the yttrium lithium fluoride melt 14 in crucible 11 are holmium and/or thulium. The quantum levels of interest in the thulium and holmium are coupled so that one pumping photon absorbed by the thulium results in two photons emitted by the holmium, as taught in U.S. Pat. No. 5,038, 353, making for an unusually efficient laser system.

The crystal is initially grown by slowly withdrawing crystal boule 12 from the un-doped yttrium lithium fluoride melt 13 in crucible 10 in a manner well known in the art. After a sufficient amount of growth has occurred on crystal boule 12, it is removed from the un-doped melt 13 and is inserted into the second crucible 11 having melt 14 doped with the holmium and or thulium active laser ions.

After a sufficient amount of crystal growth with the laser ion doped melt 14, crystal boule 12 is removed from the doped melt 14 and is re-inserted into the first crucible 10 with the un-doped melt 13 to further grow crystal boule 12 a predetermined amount. Crystal boule 12 is then removed from the un-doped melt 13 for final processing to produce a plurality of laser rods.

Figure 2:
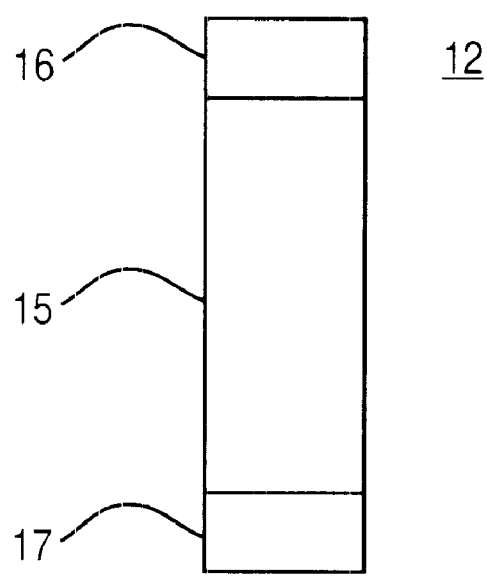
FIG. 2 shows a grown crystal boule having a laser ion doped middle segment and un-doped end segments that eliminate the need for separately made and attached end caps.

In this manner a crystal boule 12 is grown with an un-doped yttrium lithium fluoride end region 16 followed by a holmium and/or thulium doped central region 15 and another un-doped yttrium lithium fluoride end region 17, as shown in FIG. 2. When this crystal 12 is cut, ground, and polished into laser rods, in a manner well known in the art, each laser rod will have a central absorbing region 15 flanked by end regions 16 and 17, which are not absorbing. In this manner prior art bonded end caps are eliminated, along with their attendant problems as previously described, while achieving the positive advantages of prior art laser rods having end caps, as previously described.

When the crystal boule 12 is removed the first time from the un-doped yttrium lithium fluoride melt 13 and is inserted into the holmium and/or thulium doped melt 14, the melt temperature of doped melt 14 is initially raised to an increased temperature while the crystal boule 12 is lowered into contact therewith, thereby causing a few millimeters of the previously grown un-doped yttrium lithium fluoride crystal boule 12 to dissolve. The temperature of the holmium and/or thulium doped melt 14 is then lowered for proper crystal growth and crystal boule 12 is slowly pulled from melt 14 to grow the laser ion doped region 15 of crystal 12. Thus, crystallization from the liquid phase is used to grow the un-doped regions 16 and 17 as an integral part of a doped laser crystal.

Similarly, when crystal boule 12 is removed from the holmium and/or thulium doped melt 14 after growing the middle doped region 15 of crystal 12, and is reinserted into the un-doped yttrium lithium fluoride melt 13, the melt temperature of the un-doped melt 13 is initially at an increased temperature while crystal 12 is lowered into contact therewith, thereby causing a few millimeters of the previously grown laser ion doped middle region 15 to dissolve. The temperature of the un-doped melt 13 is then lowered for proper crystal growth, and crystal boule 12 is slowly pulled from melt 13 to grow the un-doped second end region 17 of crystal 12. This assures proper bonding between the doped central region 15 and the un-doped end regions 16 & 17 of crystal boule 12. Additionally, precise alignment between segments is achieved through the crystallization process.

It is an important feature of the invention, as described in the previous two paragraphs, of using the control of thermal gradients during the growth process to grow the un-doped end regions 16 & 17 on the ends of the laser crystals with an interface that is flat to the laser ion doped central region. If necessary, just prior to reinserting crystal boule 12 into either crucible 10 to 11, the end of the crystal boule can be machined flat. This will help insure a flat interface between the doped and un-doped end portions of the laser crystal.

Figure 3:
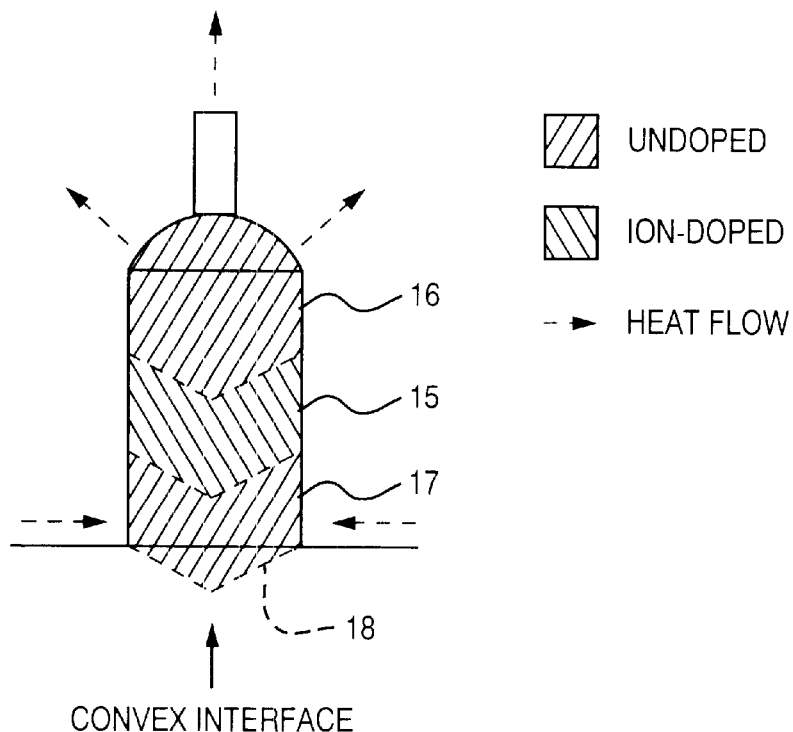
FIG. 3 shows a crystal boule grown under temperature conditions that produce a convex interface between the doped and un-doped layers of the crystal boule.
Figure 4:
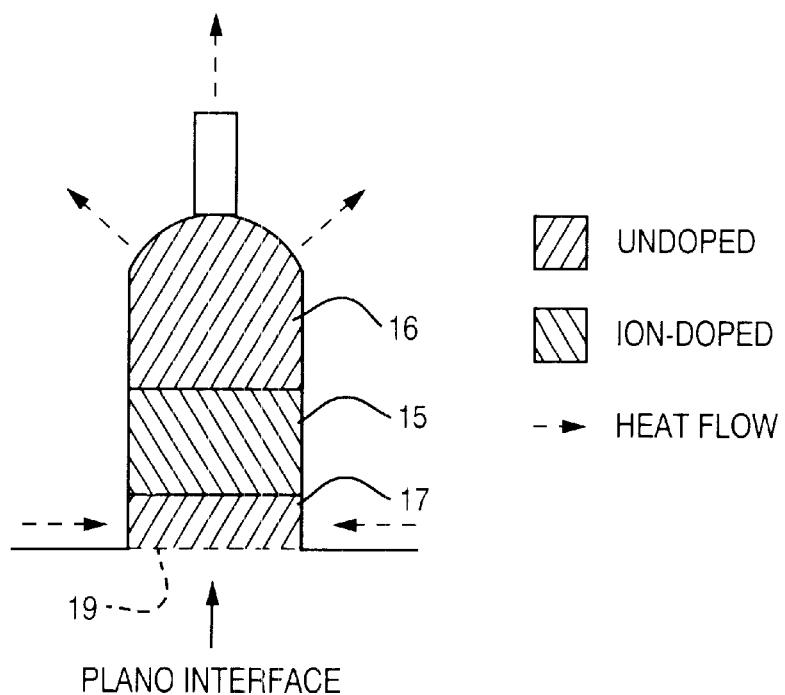
FIG. 4 shows a crystal boule grown under temperature conditions that produce a preferable planar interface between the doped and un-doped layers of the crystal boule.

The interface between the laser ion doped central region 15 and un-doped end regions 16 & 17 of crystal boule 12 can be made convex or flat by adjusting and controlling the thermal gradients in both crystal boule 12 and the melt solutions 13 and 14. A convex interface 18 is shown in FIG. 3 and a flat interface 19 is shown in FIG. 4. Generally, a flat interface 1 is desirable as shown in FIG. 4, for the reasons described above. The interface between the doped central region 15 of crystal boule 12, and the un-doped end regions 16 & 17 is a lossless interface that contributes to the efficiency of the final laser.

When crystal boule 12 has been grown, it is processed in a conventional manner into finished laser rods. It is cut into a number of individual crystal laser rods that are cut, ground and polished into finished laser rods. The non-bonded, outer end surfaces of end caps, 16 and 17 are laser polished and then coated with an appropriate laser cavity coating appropriate for the infrared lasing wavelength of the laser rods. The pump input surface of an un-doped end cap is coated with a multilayer, dichroic coating for a high reflectance at the operating wavelength of the laser and a high transmission, thus allowing the end of the composite structure to perform as an efficient reflector for the laser cavity.

The result of manufacturing laser crystals in accordance with the teaching of the present invention is the ability to eliminate thermal expansion lensing problems while high power pumping on the end of the laser rod, and to eliminate the extra cost and effort of providing and mounting separate laser end caps. The improvements are mostly in the area of manufacturing, yield, and orientation.

Many of the prior art manufacturing problems of diffusion bonding of separate end caps onto lasers have been eliminated. It is no longer necessary to polish both the laser rod and the end caps, nor is it necessary to optically contact them and cycle them through a high temperature process to obtain a diffusion bond. All of these steps represent costs that are now eliminated. It is now only necessary to cut, grind, polish and optically coat the basic laser rod, with no post-growth processing time beyond that typically incurred for fabrication.

Finally, the invention eliminates possible misalignment of the end faces with end caps, which has the potential to alter the polarization direction and reduce laser efficiency. In addition, low scatter requirements for the interface between the end caps and the central portion of the laser rod are met.

There are also manufacturing efficiencies in the growth of the laser rod itself. In growing the triplet region 16, 15 & 17, un-doped end region 16 followed by the doped central region 15 and another un-doped end region 17, it is not necessary to "bond" just one laser rod at a time. A large crystal boule 12 can be grown from which many individual laser rods can be cut side by side. A long crystal can even be grown so that several triplet regions follow one after another serially. It is possible that a single crystal boule 12 might yield twenty or thirty laser rods of the same design. In addition, these two variations may be combined to produce an even larger crystal boule from which a larger number of laser rods may be obtained.

Figure 5:
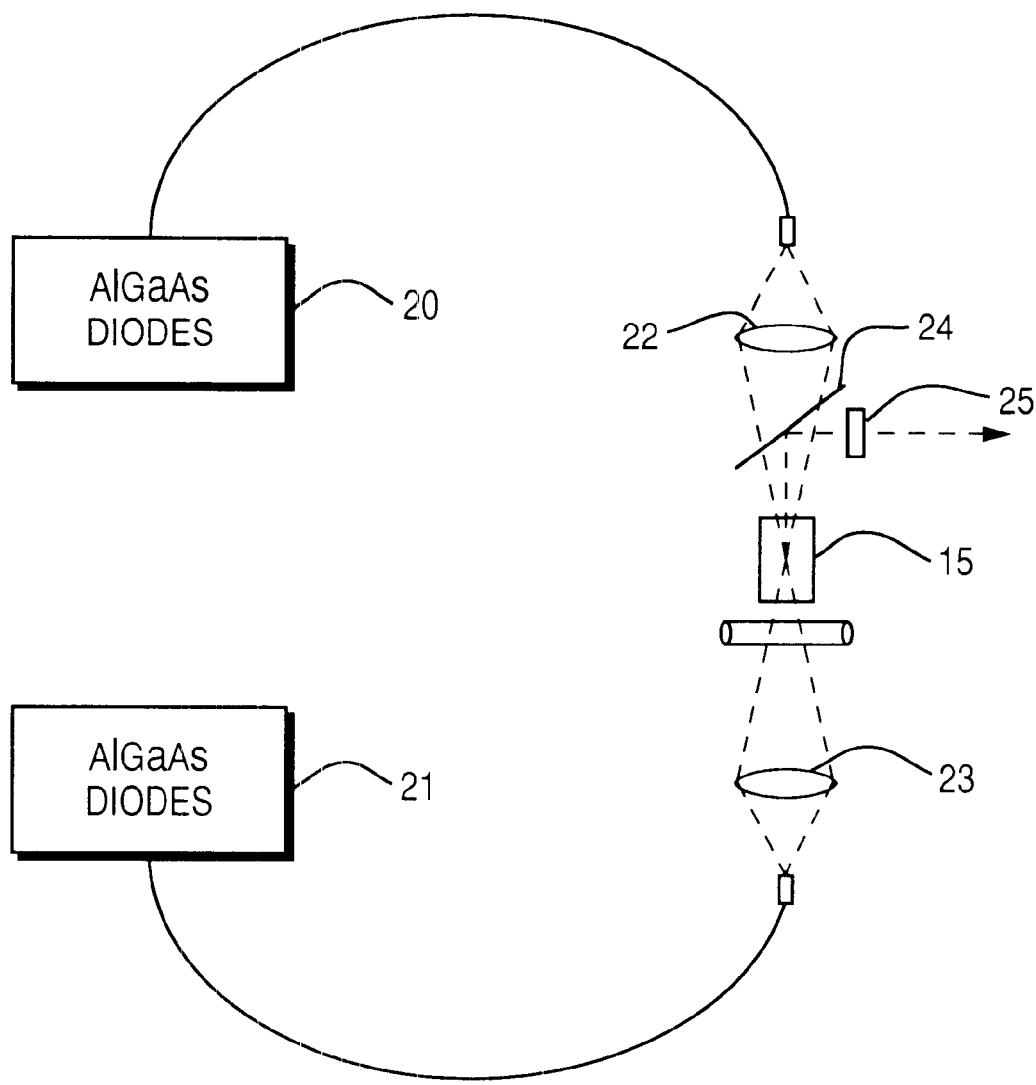
FIG. 5 shows a schematic outline of a 1.9 $\mu$m end pumped Thulium laser system utilizing a laser made per the invention.

FIG. 5 shows a diagram of use of a laser rod made using the present invention. A 1.9 μm end pumped thulium doped laser is utilized. The thulium doped yttrium lithium fluoride laser crystal has an absorption peak at 795 nm. The output wavelength of the aluminum gallium arsenide semiconductor pumping laser diodes 20 and 21 are exactly matched to this absorption peak allowing a very efficient energy transfer between the laser diodes and the crystal laser. Since the diodes themselves are very efficient at converting electrical energy to optical energy at 795 nm, a very high efficiency can be obtained for the entire laser.

Laser diodes 20 and 21 pump the laser medium 15 from opposite ends thereof with 794 nano-meter laser beams in a manner well known in the art. There is a focusing lens 22 and 23 disposed intermediate each laser diode 20 and 21 and the end pumped laser medium 15. The focusing lenses 22 and 23 focus the output of each laser diode 20 and 21 upon their respective ends of the laser medium 15 in a manner well known in the laser art.

There is also a solid state laser mirror 24 disposed at one end of laser medium 15 between lens 22 and solid state laser medium 15, preferably on-axis. Mirror 24 is configured so as to facilitate transmission of the 794 nanometer laser radiation generated by laser diode 20 through mirror 24 to laser medium 15, but reflect the laser radiation generated by laser medium 15 so as to provide the output beam 25 of the high powered solid state laser.

The integrally grown thermally conductive end caps are not shown in FIG. 5.

While what has been described herein is the preferred embodiment of the invention, it will be apparent to those skilled in the art that many changes may be made without departing from the spirit and scope of the invention. For instance, only one end of a laser rod may be pumped and have an integral end cap. Or, the end caps may be made of a different material than the base material of the laser rod.

What is claimed is:

1. A crystal boule from which a plurality of solid state lasers are manufactured, said crystal boule comprising:

a first end segment being grown from a non-laser active material; and a laser-active segment being made of a first material, said laser-active segment having a first end and a second end, the first end of said laser-active segment being grown to be integrally attached to said non-laser active first end segment during manufacture of said crystal boule;

wherein said crystal boule is cut and polished to produce said plurality of solid state laser crystals.

2. The crystal boule of claim 1 further comprising:

a second end segment being grown from a non-laser active material;

the second end of said laser-active segment being grown to be integrally attached to said non-laser active second end segment during manufacture of said crystal boule, wherein said crystal boule is cut and polished to produce a plurality of solid state laser crystals that have said three segments.

3. The crystal boule of claim 2 wherein the interface between said first end segment and said laser-active segment is planar, and the interface between said second end segment and said laser-active segment is planar.

4. The crystal boule of claim 3 wherein said first end segment and said second end segment are grown from the same material.

5. The crystal boule of claim 4 wherein said laser-active segment comprises the same material as said first end segment and said second end segment, but said material used to grow said laser-active segment is doped with an active laser ion that will cause it to lase when pumped by a proper energy source.

6. The crystal boule of claim 1 wherein the interface between said first end segment and said laser-active segment is planar.

7. The crystal boule of claim 6 wherein said laser-active segment comprises the same material as said first end segment, but said material is doped with an ion that will cause said laser active segment to lase when pumped by a proper energy source.

8. A method for growing a crystal boule from which a plurality of solid state laser are manufactured comprising the steps of:

growing a first end segment of the crystal boule from a non-laser active first material; and growing a laser active segment of the crystal boule from a second material, said laser active segment having a first end and a second end and said first end being integrally attached to said first end segment, said second material being doped with an ion that will cause said laser active segment to lase when pumped by a proper energy source.

9. The method for growing a crystal boule in accordance with claim 8 further comprising the step of:

growing a second end segment of the crystal boule from a non-laser active third material, said second end segment being integrally attached to said second end of said laser active segment.

10. A method for growing a crystal boule from a crystal seed comprising the steps of:
- inserting the crystal seed into a first melt having a non-laser active material;
- withdrawing the crystal seed from said first melt until a non-laser active first end segment has been grown;
- transferring said crystal boule from said first melt into a second melt having a laser active material; and
- withdrawing said crystal boule from said second melt until a laser active segment of said boule has been grown, said laser active segment having a first end that is grown to said first end segment and a second end.

11. The method for growing a crystal boule in accordance with claim 10 further comprising the steps of:
- transferring said crystal boule from said second melt into said first melt; and
- withdrawing the second end of said laser active segment of said crystal boule from said first melt until a non-laser active second end segment has been grown from said second end of said laser active segment.

12. The method for growing a crystal boule in accordance with claim 11, wherein said step of withdrawing said crystal boule from said second melt until a laser active segment of said boule has been grown comprises the steps of:
- raising the temperature of said second melt from a first temperature used for growing said crystal boule to a second temperature before the step of transferring said crystal boule from said first melt into said second melt;
- holding said first end segment of said crystal boule in contact with said second melt at said second temperature long enough to melt a small amount of the surface of said first end segment that is in contact with said second melt;
- lowering the temperature of said second melt to said first temperature; and
- withdrawing said crystal boule from said second melt to grow said laser active segment of said crystal boule onto said first end segment.

13. The method for growing a crystal boule in accordance with claim 12 wherein said step of withdrawing the second end of said laser active segment of said crystal boule from said first melt comprises the steps of:
- raising the temperature of said first melt from said first temperature used for growing said crystal boule to said second temperature before the step of transferring said crystal boule from said second melt into said first melt;
- holding said second end of said laser active segment of said crystal boule in contact with said first melt at said second temperature long enough to melt a small amount of the surface of said second end of said laser active segment of said crystal boule; and
- lowering the temperature of said first melt to said first temperature; and
- withdrawing said crystal boule from said first melt to grow said non-laser active second end segment of said crystal boule.

14. The method for growing a crystal boule in accordance with claim 13 wherein the interface between said first end segment and said laser-active segment of said boule is planar, and the interface between said second end segment and said laser-active segment of said boule is planar.

15. The method for growing a crystal boule in accordance with claim 10, wherein said step of withdrawing said crystal boule from said second melt until a laser active segment of said boule has been grown comprises the steps of:
- raising the temperature of said second melt from a first temperature used for growing said crystal boule to a second temperature before the step of transferring said crystal boule from said first melt into said second melt;
- holding said first end segment of said crystal boule in contact with said second melt at said second temperature long enough to melt a small amount of the surface of said first end segment that is in contact with said second melt;
- lowering the temperature of said second melt to said first temperature; and
- withdrawing said crystal boule from said second melt to grow said laser active segment of said crystal boule onto said first end segment.

16. The method for growing a crystal boule in accordance with claim 13 wherein the interface between said first end segment and said laser-active segment of said boule is planar.

17. The method for growing a crystal boule in accordance with claim 16 wherein said laser active segment comprises the same material as said first end segment, but said material is doped with an ion that will cause said laser active segment to lase when pumped by a proper energy source.

* * * * *